(12) United States Patent
Coppola

(10) Patent No.: US 7,208,218 B2
(45) Date of Patent: Apr. 24, 2007

(54) METHOD OF SUPPRESSING THE OXIDATION CHARACTERISTICS OF NICKEL

(75) Inventor: Vito A. Coppola, Prospect, CT (US)

(73) Assignee: Vishay Vitramon Incorporated, Monroe, CT (US)

( * ) Notice: Subject to any disclaimer, the term of this patent is extended or adjusted under 35 U.S.C. 154(b) by 11 days.

(21) Appl. No.: 11/219,792

(22) Filed: Sep. 6, 2005

(65) Prior Publication Data

US 2006/0039821 A1    Feb. 23, 2006

Related U.S. Application Data

(62) Division of application No. 09/824,321, filed on Apr. 2, 2001, now abandoned.

(60) Provisional application No. 60/277,465, filed on Mar. 21, 2001.

(51) Int. Cl.
*B32B 3/00* (2006.01)
*H05K 1/09* (2006.01)
*C03B 29/00* (2006.01)

(52) U.S. Cl. .............. 428/209; 174/257; 361/305; 361/751; 156/89.12

(58) Field of Classification Search ............ 361/298.4, 361/305, 309, 751; 174/257; 428/209; 156/89.12
See application file for complete search history.

(56) References Cited

U.S. PATENT DOCUMENTS 3,757,177 A * 9/1973 Buehler .................. 361/321.4
3,855,612 A   12/1974 Rosvold
3,872,360 A * 3/1975 Sheard .................... 361/305
4,055,850 A * 10/1977 Prakash ................... 361/305
4,097,911 A * 6/1978 Dorrian ................... 361/305
4,241,378 A * 12/1980 Dorrian ................... 361/305
4,604,676 A * 8/1986 Senda et al. .............. 361/309
4,985,386 A   1/1991 Tsurumi et al.
5,685,968 A * 11/1997 Hayakawa et al. ......... 205/122
6,316,100 B1  11/2001 Kodas et al.
6,355,187 B1  3/2002 Sanada et al.
6,510,040 B1 * 1/2003 Sato et al. ............... 361/321.4
6,723,280 B2 4/2004 Coppola
6,972,942 B2 * 12/2005 Ritter et al. ............. 361/306.3
7,054,137 B1 * 5/2006 Barber et al. ............ 361/321.1

FOREIGN PATENT DOCUMENTS

| EP | 0 987 721 A | 3/2000 |
|----|-------------|--------|
| GB | 1507031 A | 4/1978 |
| GB | 2242203 | 9/1991 |
| JP | 571 53253 A2 | 9/1982 |
| JP | 63 033563 A | 2/1988 |
| JP | 04 041676 A | 2/1992 |
| JP | 05 080012 A | 3/1993 |

OTHER PUBLICATIONS

Hansen, Max, Constitution of Binary Alloys, McGraw-Hill Book Company, Inc., pp. 1031-1032, 1958.

* cited by examiner

*Primary Examiner*—Cathy F. Lam
(74) *Attorney, Agent, or Firm*—McKee, Voorhees & Sease, P.L.C.

(57) ABSTRACT

A method of providing a resistance to oxidation of Nickel at high temperatures by combining Ni powder with five percent Pt resinate, and heating the same to a temperature of 500° C. to 1300° C. Electro-conductive components serving as electrodes and the like comprise a Ni/Pt powder subjected to temperatures of between 500° C. and the respective melting points of Ni and Pt.

6 Claims, 1 Drawing Sheet

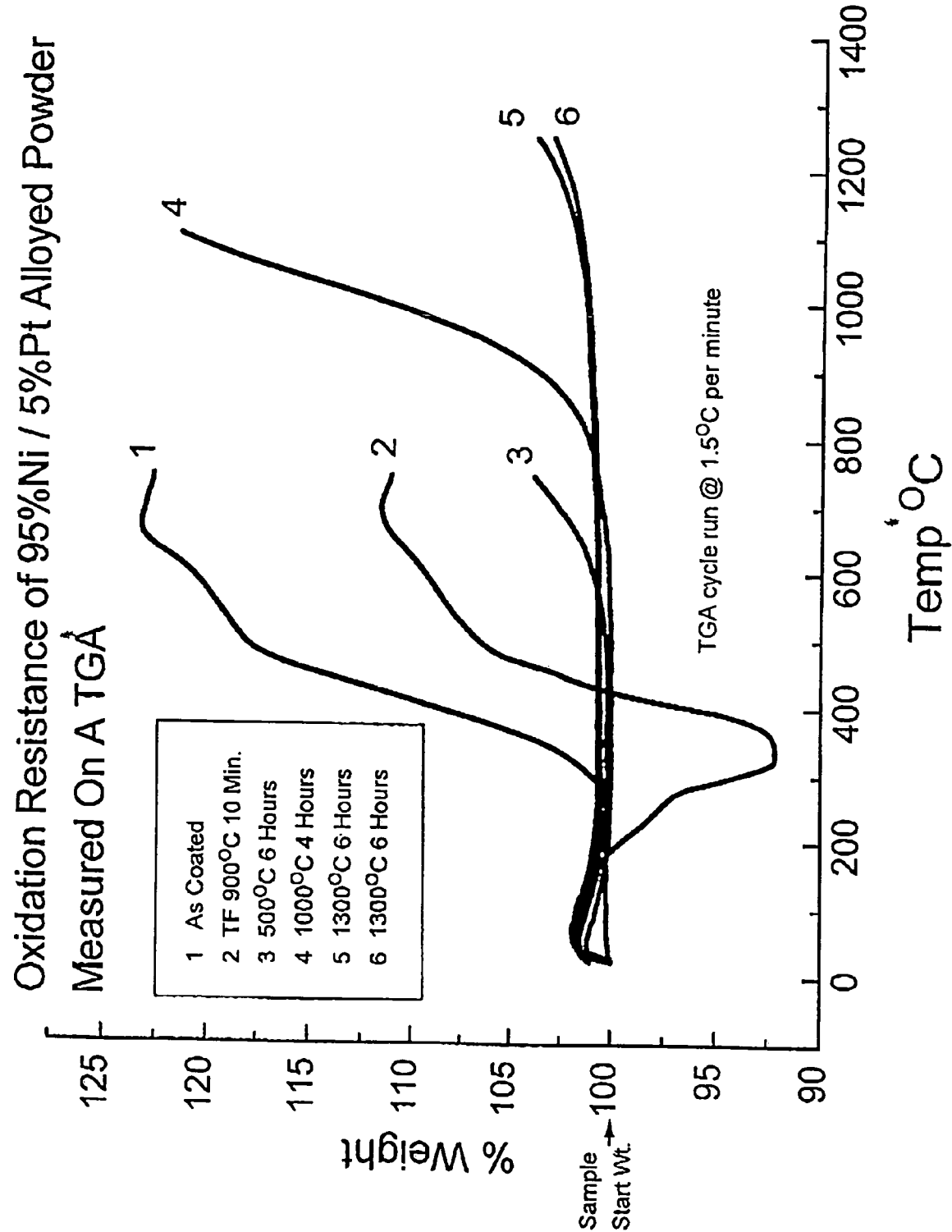

METHOD OF SUPPRESSING THE OXIDATION CHARACTERISTICS OF NICKEL

CROSS-REFERENCE TO RELATED APPLICATIONS

This application is a Divisional Application based upon U.S. Ser. No. 09/824,321 filed Apr. 2, 2001, now abandoned which is based upon Provisional Application Ser. No. 60/277,465 filed Mar. 21, 2001, herein incorporated by reference.

BACKGROUND OF THE INVENTION

One of the major problems for using nickel (Ni) in an air firing ceramic system in the capacitor industry is that this element will oxidize, before the ceramic components in the system have matured, to form a multilayer capacitor consisting of alternating layers of Ni as the conductive plates to form a capacitor. This resultant Ni oxidation can stress the capacitor during the heating cycle, which creates physical defects, such as cracks in the ceramic body. One way to overcome this, which has become very well known in the industry is to use a ceramic capacitor system, which can be fired under an inert or reducing atmosphere, thus not allowing the Ni to oxidize through the thermal processing. Unfortunately, this requires the use of reduction resistant ceramics dielectric materials that are typically formulated with expensive high purity oxides and carbonates. Furthermore the firing process requires expensive kilns with very critical controls for gas flow.

It has been known in various literatures that platinum (Pt) has the capability to suppress oxidation on various metals. It has also been known that Pt suppresses the oxidation characteristics on palladium (Pd). Heretofore, Pt has not been used to suppress the oxidation characteristics of Ni.

It is therefore a principal object of this invention to provide a method for suppressing the high temperature oxidation resistance of Ni through the use of Pt.

A further object of the invention is to produce an alloy of Ni powder add Pt resinate wherein the two ingredients are heated to a temperature of between 500° C. and the respective melting points thereof to create an Ni/Pt alloy.

These and other objects will be apparent to those skilled the art.

BRIEF SUMMARY OF THE INVENTION

A method of providing a resistance to oxidation of Ni at high-temperatures by combining Ni powder with five percent Pt resinate, and heating the same to a temperature of 500° C. to the respective melting points of Ni and Pt to create a Ni/Pt alloy. Electro-conductive components serving as electrodes and the like comprise an Ni/Pt alloy created by subjecting the above components to the above temperature range.

BRIEF DESCRIPTION OF THE DRAWINGS

FIG. 1 is a graph showing the oxidation of Ni Powder (95%) mixed with (5%) by weight of Pt and subjected to various concentrations of heat.

DETAILED DESCRIPTION OF THE PREFERRED EMBODIMENT

An experiment was conducted with coating a Ni powder using a Pt resinate. Ten grams of Ni powder and Pt resinate (liquid) which when reduced to pure metal-would be 5% of the total metal sample weight, were milled in a glass jar with a $ZrO_2$ media in alcohol. The sample was dried and screened through a 100 mesh sieve. One gram of Ni/Pt powder was mixed with one gram of electrode medium to form a paste, which was painted onto an $Al_2O_3$ substrate.

The $Al_2O_3$ substrate, with the Ni/Pt sample painted thereon, was heat treated through a nitrogen atmosphere thick film firing furnace, using a 900° C. peak temperature profile, under the nitrogen atmosphere so that the sample would not oxidize during the cycle. The resulting Ni/pt alloy was then removed from the substrate and tested with the DTA/TGA along with the control Ni/Pt alloy, to measure it's oxidation resistance. No difference in the oxidation characteristic of the control Ni/Pt alloy and this quick heat treated alloy was seen.

It should be understood that the use of Pt resinate (a liquid) was used as a convenience. Pt powder in the same proportions can be mixed with Ni powder and then heat treated as described herein to achieve the same resulting alloy. Several samples of this Ni/Pt powder were prepared in the manner described above and heat treated at various different temperature and time to determine if this system might require more heat energy to allow the Pt to alloy with the Ni. The heat treatment profiles were as follows: 500° C. for 4 hours, 1000° C. for 6 hours and 1300° C. for 6 hours.

Each of the samples was heat treated in a high temperature nitrogen and form gas capable furnace, in an atmosphere of forming gas (1% hydrogen, balance nitrogen). The samples were tested with the DTA/TGA for oxidation characteristics. (See FIG. 1).

The 500° C. heat treat sample clearly showed the Ni powder oxidation start point had shifted to 500° C. The oxidation point of the 1000° C. heat treat samples shifted further to between 700° C. and 800° C. The 1300° C. heat treat samples performed even better, shifting the oxidation start point to over 1000° C. A repeat sample was prepared and heat treated at 1300° C. and it performed similar to the previous run.

It was determined that the resistance to oxidation of the Ni was favorable from 500° C. up to the melting points of Ni and Pt (which are approximately 1453 and 1772° C., respectively).

FIG. 1 shows 5 curves on a graph which show the oxidation rate of the 95/5% mixture of Ni and Pt subjected to different temperatures. The increase in weight is caused by the additional weight of NiO produced by the oxidation of the Ni.

This result has shown that Pt resinate mixed with Ni at 5% by weight of Pt when heat treated properly is capable of suppressing the oxidation characteristics of Ni, so that it can function as air-fireable electrode, with significant cost savings (The resulting alloy from a mixture of Ni and Pt resinate is comprised of Ni and Pt for the "resinate" is vaporized in the heating process.)

Aside from the capability for multilayer ceramic capacitor conductive plates or electrodes described above, other uses of the Ni/Pt combination are possible. As an air-fireable end termination for an electronic component which requires metallization to make the component circuit broad mountable as a SMT (Surface Mount Technology) product; or as a hick film screen printable air-fireable conductor material. The production of the Ni/Pt alloy is the most significant aspect of this invention.

It is therefore seen that this invention will achieve its stated objectives.

What is claimed is:

1. An electronic component comprising:
   a ceramic substrate;
   an air-fireable end termination element resistant to oxidation in air of up to 1200° C., said element is comprised of a nickel and platinum alloyed product deposited onto the ceramic substrate, said alloyed product is formed from a combination of Ni powder and Pt resinate heat treated to a temperature between 1000° C. and a melting point of Ni in a reducing atmosphere, wherein Ni is presented in a proportion of at least 90% by weight with Pt making up the balance.

2. The electronic component of claim 1, wherein the element has the proportion of Ni to Pt in approximately 95% to 5% by weight, respectively.

3. A capacitor comprising a ceramic substrate and an air-fireable conductor plate that is resistant to oxidation in air of up to 1200° C., said conductor plate is comprised of:
   a nickel and platinum alloyed product, said alloyed product is heat treated to a temperature between 1000° C. and a melting point of Ni in a reducing atmosphere, said alloyed product is formed from a combination of Ni powder and Pt resinate, wherein Ni is presented in a proportion of at least 90% by weight and Pt making up the balance.

4. The capacitor of claim 3, wherein said alloyed product has the proportion of Ni to Pt in approximately 95% to 5% by weight, respectively.

5. An electronic component comprising an electrode screen printed onto a ceramic substrate, said electrode is an air-fireable conductor material that is resistant to oxidation in air of up to 1200° C., said conductor material is comprised of:
   a nickel and platinum alloyed product, said alloyed product is heat treated to a temperature between 1000° C. and a melting point of Ni in a reducing atmosphere, said alloyed product is formed from a combination of Ni powder and Pt resinate, wherein Ni is presented in a proportion of at least 90% by weight with Pt making up the balance.

6. The electronic component of claim 5, wherein the alloyed product has the proportion of Ni to Pt in approximately 95% to 5% by weight, respectively.

* * * * *